US011398532B2

(12) United States Patent
Yoshimura et al.

(10) Patent No.: US 11,398,532 B2
(45) Date of Patent: Jul. 26, 2022

(54) LIGHT-EMITTING DEVICE, LIGHT WAVELENGTH CONVERSION DEVICE, AND DISPLAY DEVICE (71) Applicant: SHARP KABUSHIKI KAISHA, Sakai (JP)

(72) Inventors: Kenichi Yoshimura, Sakai (JP); Tadashi Kobashi, Sakai (JP); Masashi Kago, Sakai (JP); Tatsuya Ryohwa, Sakai (JP); Makoto Izumi, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 21 days.

(21) Appl. No.: 17/040,929

(22) PCT Filed: Mar. 28, 2018

(86) PCT No.: PCT/JP2018/013030
§ 371 (c)(1),
(2) Date: Sep. 23, 2020

(87) PCT Pub. No.: WO2019/186844
PCT Pub. Date: Oct. 3, 2019

(65) Prior Publication Data
US 2021/0020699 A1 Jan. 21, 2021

(51) Int. Cl.
H01L 27/32 (2006.01)
G02F 1/1335 (2006.01)
(Continued)

(52) U.S. Cl.
CPC ...... H01L 27/322 (2013.01); G02F 1/133514 (2013.01); H01L 27/3211 (2013.01);
(Continued)

(58) Field of Classification Search
CPC . H01L 27/322; H01L 27/3211; H01L 51/502; H01L 51/52; H01L 51/0097;
(Continued)

(56) References Cited

U.S. PATENT DOCUMENTS

2015/0115217 A1* 4/2015 Cho ............... H01L 51/5218
257/13
2016/0351757 A1 12/2016 Yoshimura et al.
(Continued)

FOREIGN PATENT DOCUMENTS

JP 2014-026785 A 2/2014
JP 2016-219748 A 12/2016
(Continued)

OTHER PUBLICATIONS

Jaehoon Lim et. al., "Highly Efficient Cadmium-Free Quantum Dot Light-Emitting Diodes Enabled by the Direct Formation of Excitons within InP@ZnSeS Quantum Dots", ACS Nano vol. 7 No. 10 pp. 9019-9026, 2013.

Primary Examiner — Kevin Quarterman
(74) Attorney, Agent, or Firm — ScienBiziP, P.C.

(57) ABSTRACT

A light-emitting device includes: an anode electrode; a cathode electrode; a plurality of light-emitting layers sandwiched between the anode electrode and the cathode electrode; and a light absorption layer disposed between the plurality of light-emitting layers and a light extraction surface, wherein the plurality of light-emitting layers include InP based quantum dots and are configured to emit at least green color of light and red color of light, and the light absorption layer selectively absorbs light at 570 to 610 nm.

12 Claims, 9 Drawing Sheets (51) Int. Cl.
  *H01L 51/50* (2006.01)
  *H01L 51/52* (2006.01)
  *G02F 1/13357* (2006.01)
  *H01L 51/00* (2006.01)

(52) U.S. Cl.
  CPC ............ *H01L 51/502* (2013.01); *H01L 51/52* (2013.01); *G02F 1/133617* (2013.01); *H01L 51/0097* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5253* (2013.01); *H01L 2227/326* (2013.01); *H01L 2251/5338* (2013.01)

(58) Field of Classification Search
  CPC ............ H01L 51/5056; H01L 51/5072; H01L 51/5088; H01L 51/5092; H01L 51/5206; H01L 51/5253; H01L 2227/326; H01L 2251/5338; H01L 33/04; G02F 1/133514; G02F 1/133617; G02F 1/133603; G02F 1/133624; G02B 5/20; G02B 5/22; H05B 33/12; H05B 33/14; G09F 9/30
  See application file for complete search history.

(56) References Cited

U.S. PATENT DOCUMENTS

| | | |
|---|---|---|
| 2017/0104049 A1 | 4/2017 | Nakamura et al. |
| 2017/0179438 A1* | 6/2017 | Xu ........................ H01L 27/322 |
| 2018/0033362 A1 | 2/2018 | Yamazaki et al. |
| 2018/0138434 A1* | 5/2018 | Yoon .................. H01L 29/6609 |
| 2018/0182990 A1* | 6/2018 | Youn .................... H01L 51/5044 |
| 2018/0188579 A1* | 7/2018 | Jeong .................. G02F 1/13336 |
| 2019/0109290 A1* | 4/2019 | Trefonas, III ....... G06F 3/03542 |

FOREIGN PATENT DOCUMENTS

| | | |
|---|---|---|
| JP | 2017-076123 A | 4/2017 |
| JP | 2018-025779 A | 2/2018 |

* cited by examiner

LIGHT-EMITTING DEVICE, LIGHT WAVELENGTH CONVERSION DEVICE, AND DISPLAY DEVICE

TECHNICAL FIELD

The disclosure relates to a light-emitting device including a light-emitting element including quantum dots.

BACKGROUND ART

In light-emitting devices (QLED) in which Cd-free InP based quantum dots (QD) are used as a light-emitting layer, those which have the half widths of the light emission spectrums of the green color and the red color as small as those of Cd based materials are known as the related art.

SUMMARY

Figure 3:
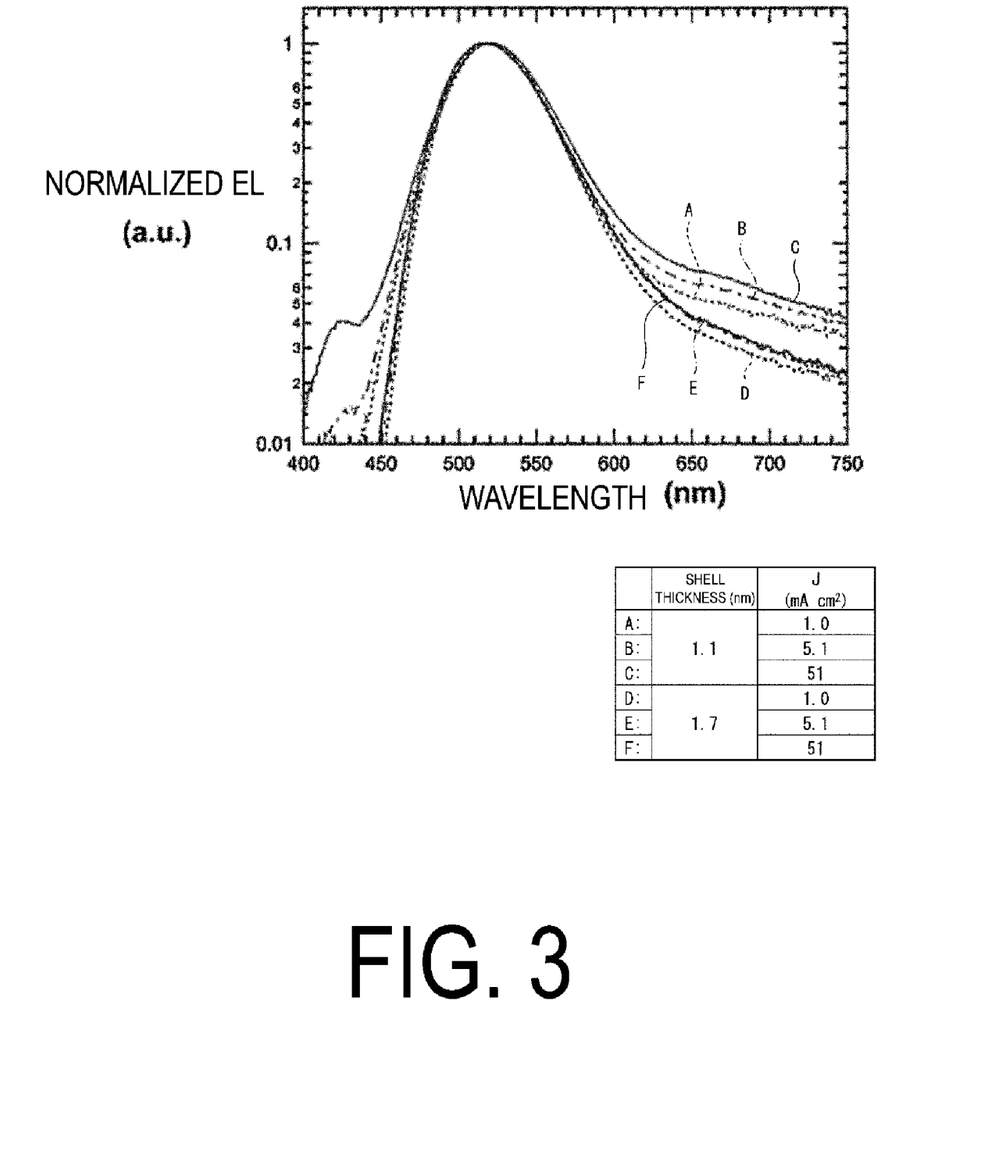
FIG. 3 is a diagram illustrating a normalized EL light emission spectrum at different current densities of an InP based QLED.

However, as illustrated in FIG. 3, in Jaehoon Lim et. al. "Highly Efficient Cadmium-Free Quantum Dot Light-Emitting Diodes Enabled by the Direct Formation of Excitons within InP@ZnSeS Quantum Dots", ACS Nano 7(10) (2013) pp. 9019-9026, even though the half widths of the light emission spectrums of the green color and the red color are as small as those of Cd based materials, the color reproduction range does not spread sufficiently, and there has been a problem in that only a color reproduction range of less than 80% in BT.2020 ratio can be achieved.

An object of an aspect of the disclosure is to realize a light-emitting device that is Cd free, has high light emission efficiency, and has a wide color reproduction range.

In order to solve the problem described above, a light-emitting device according to an aspect of the disclosure includes: an anode electrode; a cathode electrode; a plurality of light-emitting layers sandwiched between the anode electrode and the cathode electrode; and a light absorption layer disposed between the plurality of light-emitting layers and a light extraction surface, wherein the plurality of light-emitting layers include InP based quantum dots and are configured to emit at least green color and red color, and the light absorption layer selectively absorbs light at 570 to 610 nm.

Advantageous Effects of Disclosure

According to the configuration described above, an effect is exhibited that a light-emitting device that is Cd free, has high light emission efficiency, and has a wide color reproduction range can be realized.

According to an aspect of the disclosure, a light-emitting device that is Cd free, has high light emission efficiency, and has a wide color reproduction range can be realized.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
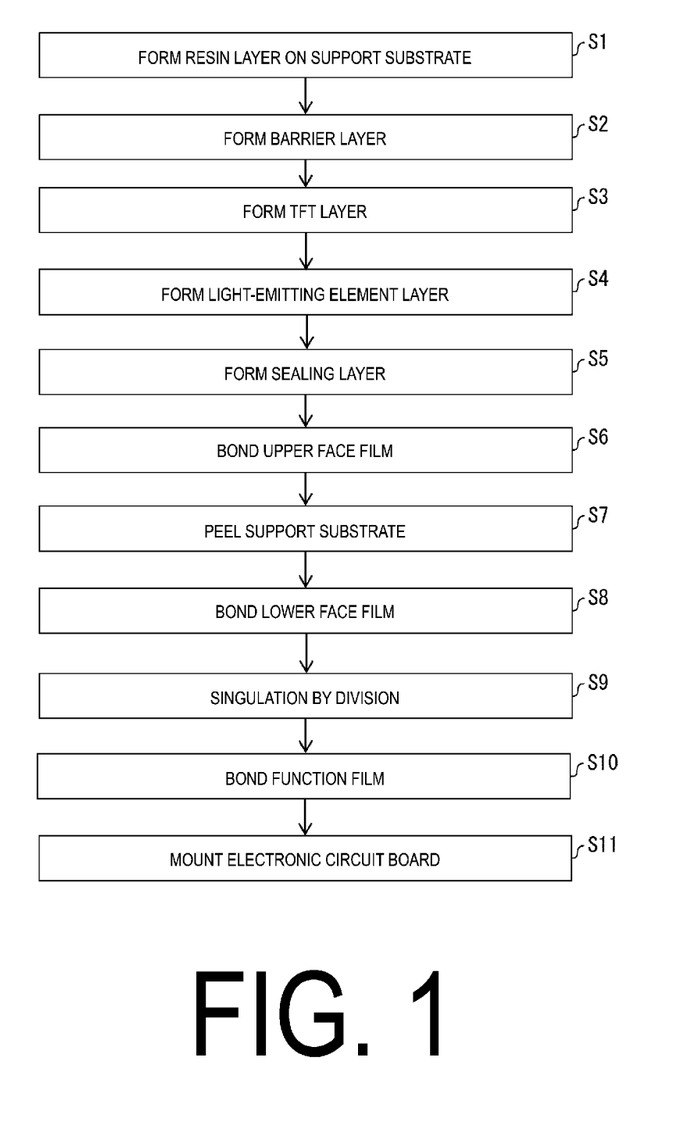
FIG. 1 is a flowchart illustrating an example of a method for manufacturing a light-emitting device.
Figure 2:
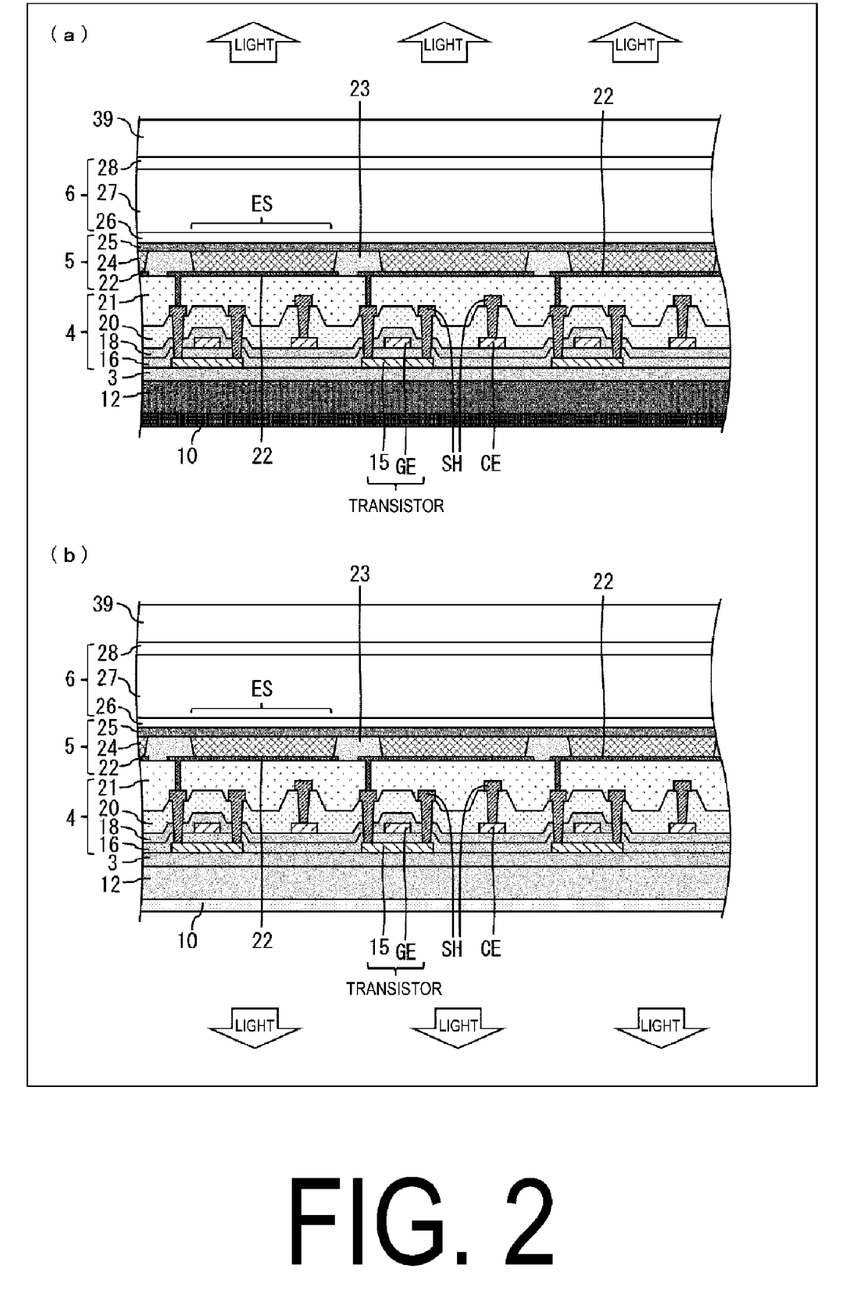
FIG. 2 is a cross-sectional view illustrating an example of a configuration of a display region of the light-emitting device.

FIG. 1 is a flowchart illustrating an example of a method for manufacturing a light-emitting device. FIG. 2 is a cross-sectional view illustrating a configuration of a display region of the light-emitting device. More specifically, FIG. 2(a) illustrates a top-emitting type light-emitting device, and FIG. 2(b) illustrates a bottom-emitting type light-emitting device.

In a case where a flexible light-emitting device is manufactured, as illustrated in FIG. 1 and FIG. 2, first, a resin layer 12 is formed on a transparent support substrate (a mother glass, for example) (step S). Next, a barrier layer 3 is formed (step S2). Next, a TFT layer 4 is formed (step S3). Next, a top-emitting type light-emitting element layer 5 is formed (step S4). Next, a sealing layer 6 is formed (step S5). Next, an upper face film is bonded to the sealing layer 6 (step S6).

Next, the support substrate is peeled from the resin layer 12 by irradiation of laser light, and the like (step S7). Next, a lower face film 10 is bonded to a lower face of the resin layer 12 (step S8). Next, a layered body including the lower face film 10, the resin layer 12, the barrier layer 3, the TFT layer 4, the light-emitting element layer 5, and the sealing layer 6 is divided and a plurality of individual pieces are obtained (step S9). Next, a function film 39 is bonded on the obtained individual pieces (step S10). Next, an electronic circuit board (for example, an IC chip and an FPC) is mounted on a portion (terminal portion) outside (non-display region, frame) of the display region in which a plurality of subpixels are formed (step S11). Note that a light-emitting device manufacturing apparatus (including a film formation apparatus that performs the steps S1 to S5) performs steps S1 to S11.

Examples of the material of the resin layer 12 include a polyimide or the like. The portion of the resin layer 12 can be replaced by a two-layer resin film (for example, a polyimide film) and an inorganic insulating film sandwiched therebetween.

The barrier layer 3 is a layer that inhibits foreign matters such as water and oxygen from invading the TFT layer 4 or the light-emitting element layer 5, and can be constituted by a silicon oxide film, a silicon nitride film, or a silicon oxynitride film, or by a layered film of these, formed by a CVD method, for example.

The TFT layer 4 includes a semiconductor film 15, an inorganic insulating film 16 (gate insulating film) in an upper layer than the semiconductor film 15, a gate electrode GE and a gate wiring line GH in an upper layer than the inorganic insulating film 16, an inorganic insulating film 18 in an upper layer than the gate electrode GE and a gate wiring line GH, a capacitance electrode CE in an upper layer than the inorganic insulating film 18, an inorganic insulating film 20 in an upper layer than the capacitance electrode CE, a source wiring line SH in an upper layer than the inorganic insulating film 20, and a flattening film 21 (interlayer insulating film) in an upper layer than the source wiring line SH.

The semiconductor film 15 is constituted of, for example, a low-temperature polysilicon (LTPS) or an oxide semiconductor (for example, an In—Ga—Zn—O based semiconductor), and a transistor (TFT) is configured to include the semiconductor film 15 and the gate electrode GE. FIG. 2 illustrates the transistor that has a top gate structure, but the transistor may have a bottom gate structure.

The gate electrode GE, the gate wiring line GH, the capacitance electrode CE, and the source wiring line SH are each composed of a single layer film or a layered film of a metal, for example, including at least one of aluminum, tungsten, molybdenum, tantalum, chromium, titanium, and copper, for example. The TFT layer 4 in FIG. 2 includes a single layer of a semiconductor layer and three layers of metal layers.

Each of the inorganic insulating films 16, 18, and 20 can be formed of, for example, a silicon oxide (SiOx) film or a silicon nitride (SiNx) film, or a layered film of these, formed by using a CVD method. The flattening film 21 may be a resin layer formed of, for example, a coatable organic material such as polyimide and acrylic.

The light-emitting element layer 5 includes an anode 22 as an upper layer of the flattening film 21, an insulating anode cover film 23 configured to cover an edge of the anode 22, an electroluminescence (EL) layer 24 as an upper layer of the anode cover film 23, and a cathode 25 as an upper layer of the EL layer 24. The anode cover film 23 is formed by applying an organic material such as a polyimide or an acrylic and then by patterning the organic material by photolithography, for example.

For each subpixel, light-emitting elements ES including island shaped anodes 22, EL layers 24, and a cathode 25 (for example, an organic light-emitting diode (OLED), a quantum dot diode (QLED)) are formed in the light-emitting element layer 5, and subpixel circuits for controlling the light-emitting elements ES are formed in the TFT layer 4.

For example, the EL layers 24 are formed by layering a hole injection layer, a hole transport layer, a light-emitting layer, an electron transport layer, and an electron injection layer in this order, from the lower layer side. The light-emitting layer is formed into an island shape on openings of the anode cover film 23 (subpixel-by-subpixel basis) by vapor deposition or an ink-jet method. Other layers are formed in an island shape or a solid-like shape (common layer). A configuration is also possible in which one or more layers are not formed, out of the hole injection layer, the hole transport layer, the electron transport layer, and the electron injection layer.

The light-emitting layer of the QLED can, for example, form an island shaped light-emitting layer (corresponding to one subpixel) by ink-jet coating a solvent having quantum dots diffused therein.

In a case of a top-emitting type, the anodes (anode electrodes) 22 are formed by layering of Indium Tin Oxide (ITO) and silver (Ag) or alloy containing Ag, for example, and have light reflectivity. The cathode (cathode electrode) 25 can be formed of a transparent conductive material such as MgAg alloy (ultra-thin film), ITO, Indium Zinc Oxide (IZO), and IGZO (InGaZnOx: trade name). On the other hand, in a case of a bottom-emitting type, it is preferable that the anodes (anode electrodes) 22 are configured by, for example, Indium Tin Oxide (ITO), IZO, IGZO (InGaZnOx: trade name) and the like, and to have optical transparency.

In a case where the light-emitting element ES is the QLED, holes and electrons recombine inside the light-emitting layer in response to a drive current between the anode 22 and the cathode 25, and light (fluorescent light) is emitted in the process in which the excitons generated by the recombination changes from the conduction band level of quantum dot to the valence band level.

A light-emitting element other than the QLED (such as an inorganic light-emitting diode) may be formed in the light-emitting element layer 5.

The sealing layer 6 is transparent, and includes an inorganic sealing film 26 for covering the cathode 25, an organic layer formed from an organic buffer film 27 in an upper layer than the inorganic sealing film 26, and an inorganic sealing film 28 in an upper layer than the organic buffer film 27. The sealing layer 6 covering the light-emitting element layer 5 inhibits foreign matter, such as water and oxygen, from penetrating to the light-emitting element layer 5.

Each of the inorganic sealing film 26 and the inorganic sealing film 28 is an inorganic insulating film, and can be formed of, for example, a silicon oxide film, a silicon nitride film, or a silicon oxynitride film, or a layered film of these, formed by a CVD method. The organic buffer film 27 is a transparent organic film having a flattening effect and can be formed of a coatable organic material such as acrylic. The organic buffer film 27 can be formed, for example, by ink-jet application, but a bank for stopping liquid droplets may be provided in the non-display region.

The lower face film 10 is, for example, a PET film bonded on the lower face of the resin layer 12 after the support substrate is peeled off, for achieving the light-emitting device with excellent flexibility. The function film 39 has at least one of an optical compensation function, a touch sensor function, a protection function, for example.

A flexible light-emitting device has been described in the above, but in a case of manufacturing a non-flexible light-emitting device, a formation of a resin layer, a replacement of the base material, and the like are unnecessary in general, and thus, for example, a layering process of steps S2 to S5 is performed on the glass substrate, and then the process proceeds to step S9.

Wavelength Dependence of Light Emission Spectrum

Hereinafter, a QLED in which quantum dots are diffused in the light-emitting layer will be described.

FIG. 3 is a diagram illustrating a normalized EL light emission spectrum at different current densities of an InP based QLED. The graph illustrated in FIG. 3 is a graph according to FIG. 4 of Jaehoon Lim et. al. "Highly Efficient Cadmium-Free Quantum Dot Light-Emitting Diodes Enabled by the Direct Formation of Excitons within InP@ZnSe Quantum Dots", ACS Nano 7(10) (2013) pp. 9019-9026. Specifically, the wavelength dependences of the EL light emission spectrums of red (shell thickness 1.1 nm) and green (shell thickness 1.7 nm) of the InP based QLED are illustrated. In the graph illustrated in FIG. 3, spectrum A, B, and C indicate a red light emission spectrum, and spectrum D, E, and F indicate a green light emission spectrum. It can be seen that the light emission spectrum of the InP based QLED has thick tail of the light emission spectrum even at the same half width as compared to the Cd based material. The color reproduction range of the InP based QLED decreases due to the long wavelength side tail for the green light emission spectrum (D, E, F), and due to the short wavelength side tail for the red light emission spectrum (A, B, C). There is a technique for reducing tails by increasing the shell thickness of quantum dots (QDs) (Jaehoon Lim et. al. "Highly Efficient Cadmium-Free Quantum Dot Light-Emitting Diodes Enabled by the Direct Formation of Excitons within InP@ZnSeS Quantum Dots", ACS Nano 7(10) (2013) pp. 9019-9026), but it is insufficient to correspond to BT.2020.

First Embodiment

Figure 4:
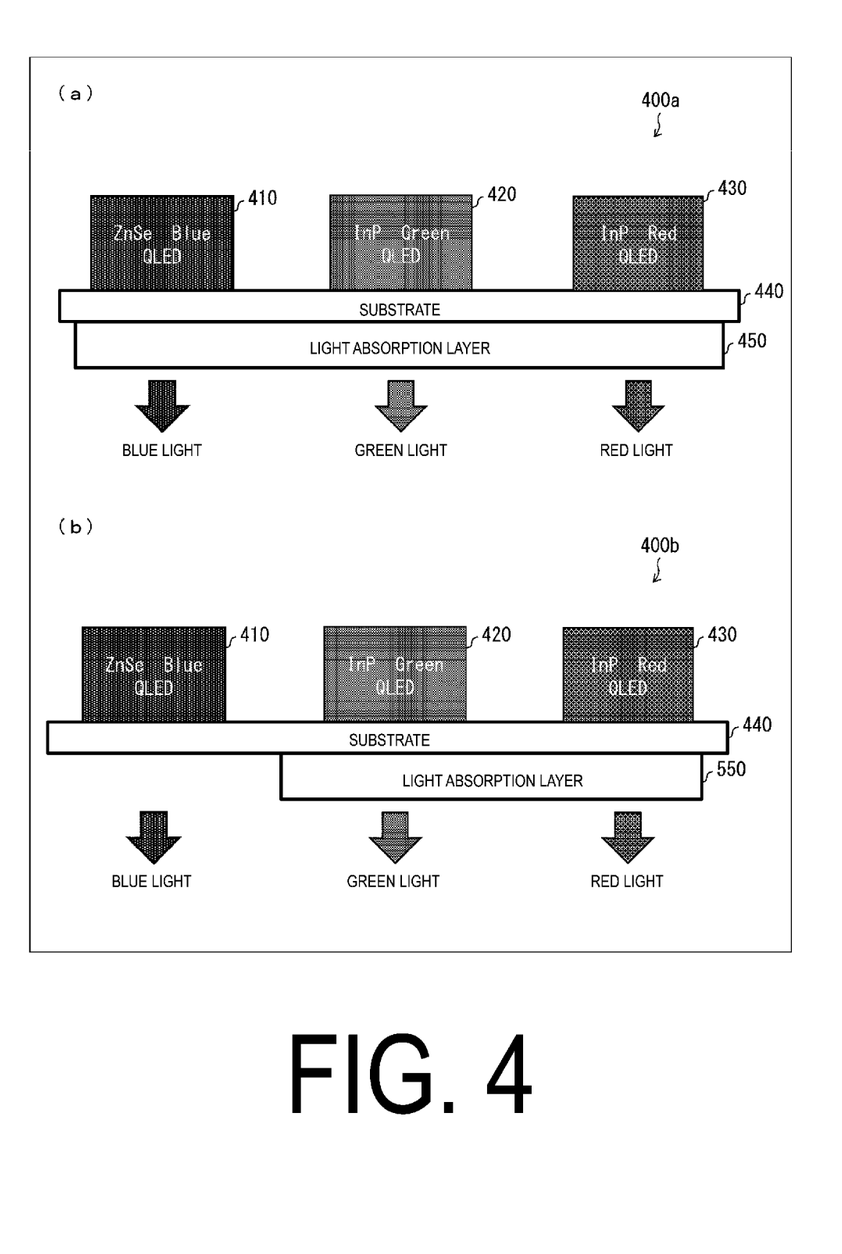
FIG. 4 is a diagram schematically illustrating QLED devices according to a first embodiment of the disclosure.

Hereinafter, an embodiment of the disclosure will be described in detail. FIG. 4 is a diagram schematically illustrating QLED devices 400a and 400b according to a first embodiment of the disclosure. A light-emitting layer including InP based quantum dots is deposited on a substrate 440. A blue light-emitting layer 410 is preferably composed of a ZnSe based material. A green light-emitting layer 420 and a red light-emitting layer 430 are preferably composed of InP based materials. A light absorption layer 450 or 550 is provided on a surface opposite to the surface on which the light-emitting layer of the substrate 440 is deposited. It is preferable that the light absorption layer 450 or 550 selectively absorbs light at 570 to 610 nm. The light absorption layer 450 or 550 selectively absorbs light at 570 to 610 nm, thereby reducing the tail of the light emission spectrum.

Figure 5:
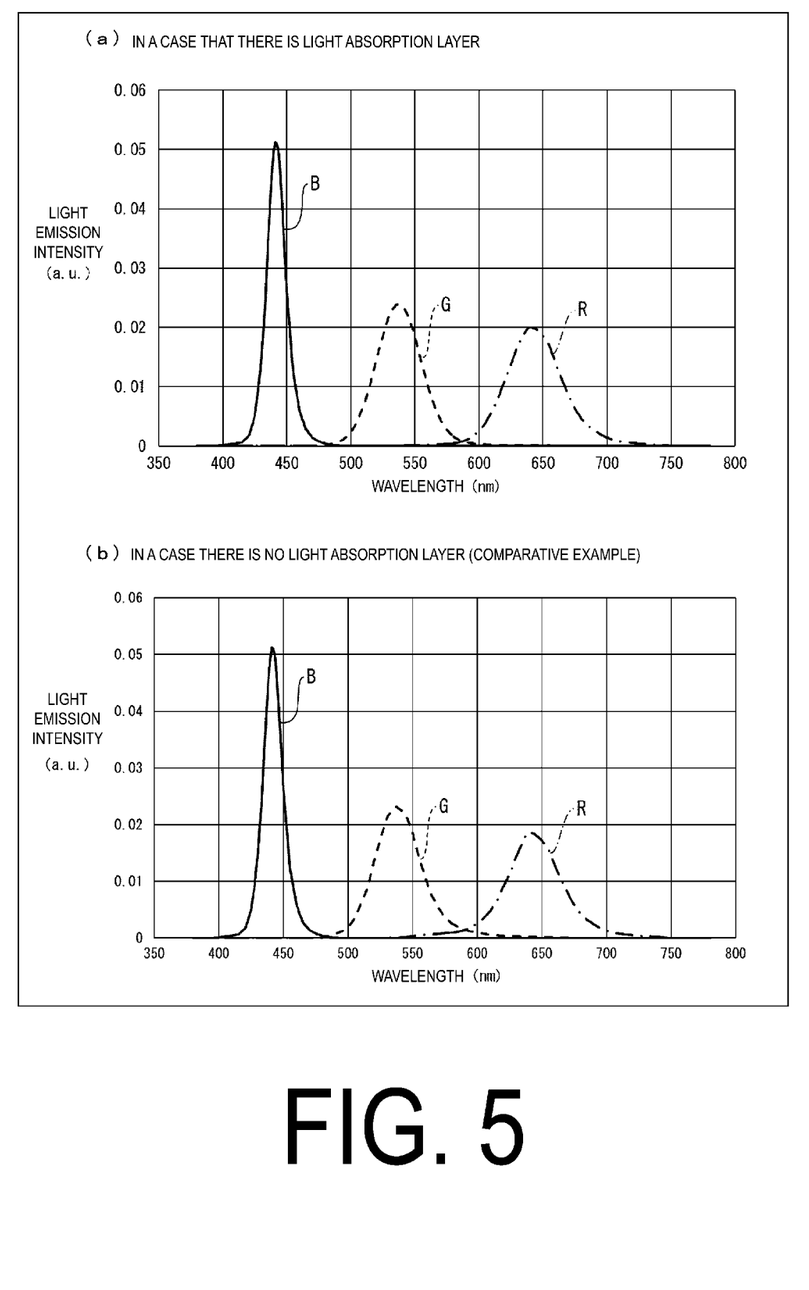
FIG. 5 is a diagram illustrating graphs of light emission spectrums illustrating the light emission intensity of the QLED device.

FIG. 5 is a diagram illustrating graphs of light emission spectrums illustrating the light emission intensity of the QLED device. FIG. 5(a) illustrates a light emission spectrum of a QLED device including the light absorption layer 450 or 550 having the configuration of the first embodiment. For comparison, FIG. 5(b) illustrates a light emission spectrum of a QLED device in which the light absorption layer 450 or 550 has been removed from the configuration of the first embodiment. As illustrated in FIG. 5(a), it can be seen that the peak wavelength in the light emission spectrum of the green color (G) is 520 nm to 550 nm, and the peak wavelength in the light emission spectrum of the red color (R) is 620 nm to 650 nm. It can be seen that the half widths of the light emission spectrums of the green color (G) and the red color (R) are less than 50 nm. In comparison between FIG. 5(a) and FIG. 5(b), it can be seen that there is a reduction in the overlapping of the tails of the spectrums near 570 to 610 nm. It can be seen from such comparison that high color reproducibility can be achieved with sharp light emission spectrum. Note that the peak wavelength in the light emission spectrum of the green color (G) is more preferably 520 nm to 540 nm, the peak wavelength in the light emission spectrum of the red color (R) is more preferably 625 nm to 640 nm, and the half widths of the light emission spectrums of the green color (G) and the red color (R) are more preferably less than 40 nm.

In a case where the color reproduction range is calculated from the spectrums of R, G, and B, in the configuration without the light absorption layer illustrated in FIG. 5(b), BT.2020 ratio is 75.1% in CIE1931 chromaticity diagram. In contrast, in the configuration provided with the light absorption layer 450 or 550 illustrated in FIG. 5(a), BT.2020 ratio is 81.1% in CIE1931 chromaticity diagram. Therefore, the light-emitting device of the present embodiment having the light absorption layer 450 or 550 illustrated in FIG. 4 has excellent red and green color separation, and a color range greater than or equal to 80% in BT.2020 ratio can be achieved. For reference, in CIE1976, the color reproducibility in the configuration without the light absorption layer illustrated in FIG. 5(b) is 90.4%, while the color reproducibility in the configuration provided with the light absorption layer 450 or 550 illustrated in FIG. 5(a) is 98.7%. Even in CIE1976, it can be seen that a high color reproducibility can be achieved by the configuration provided with the light absorption layer 450 or 550 illustrated in FIG. 5(a).

The light emission spectrums for the wavelengths ($\lambda$) for the green color (G) and the red color (R) are analyzed according to the configuration provided with the light absorption layer 450 or 550 illustrated in FIG. 5(a). In a case that the light emission spectrum of the green light is G ($\lambda$), the peak wavelength of the light emission spectrum of the green color is GP, and the half width of the light emission spectrum of the green color is GHW, the following relationship is satisfied.

$$G(GP+GHW)/G(GP) < 0.02$$

In a case that the light emission spectrum of the red light is R ($\lambda$), the light emission spectrum peak wavelength of the red color is RP, and the half width of the light emission spectrum peak of the red color is RHW, the following relationship is satisfied.

$$R(RP-RHW)/R(RP) < 0.08$$

By satisfying the conditions described above, the color separation of red and green is excellent, and a color range greater than or equal to 80% in BT.2020 ratio can be achieved.

In a case of focusing on the light emission intensity at 590 nm in the same configuration, the following relationships are satisfied.

$$G(590\ nm)/G(GP) < 0.03$$

$$R(590\ nm)/R(RP) < 0.05$$

By satisfying the conditions described above, the color separation of red and green is excellent, and a color range greater than or equal to 80% in BT.2020 ratio can be achieved.

Light Absorption Layer

In the light absorption layer 450 or 550 illustrated in FIG. 4, organic coloring materials such as organic pigments, organic dyes, and the like, or metal nanoplates and the like dispersed in a transparent substrate are preferably used as light absorbing materials. In particular, a mode in which metal nanoparticles or organic pigments are dispersed in a transparent member is preferable as the light absorbing materials. Among these, a transparent resin in which metal nanoplates are dispersed as the light absorbing material is preferable, and a silicone type, epoxy type, acrylic type, or the like can be appropriately used as the transparent resin. In particular, silicone types are stable and preferred. For the metal nanoplate, a silver nanoplate is preferable because the silver nanoplate exhibits excellent light absorption characteristics.

In the QLED device 400a illustrated in FIG. 4(a), it can be seen that the light absorption layer 450 is deposited throughout the substrate 440. The light absorption layer 450 functions as a light absorption layer for the output light of all the blue light-emitting layer 410, the green light-emitting layer 420, and the red light-emitting layer 430. In contrast, JP 2014-26785 A is a patent in which an electric field light-emitting element and a color filter are combined, and a color filter must be used for each of R, G, and B (see FIG. 1 in JP 2014-26785 A). The process of providing a color filter for each of R, G, and B is cumbersome and also causes reduced yield. In contrast, the light absorption layer 450 illustrated in FIG. 4(a) of the present embodiment is deposited throughout the substrate 440 so as to function as one light absorption layer 450 for the output light of all the blue light-emitting layer 410, the green light-emitting layer 420, and the red light-emitting layer 430. Such a configuration simplifies the process. However, in view of the fact that the light absorption layer 450 of the present embodiment selectively absorbs light at 570 to 610 nm, the light absorption layer 450 of the present embodiment essentially does not function for the blue light-emitting layer 410 formed from blue quantum dots, and therefore it is also preferable to have a configuration such as the QLED device 400b illustrated in FIG. 4(b). Specifically, the light absorption layer 450 is deposited over a portion of the substrate 440 so as to function for the output light of the green light-emitting layer 420 and the red light-emitting layer 430.

Second Embodiment

Another embodiment of the disclosure will be described below. Note that, for the convenience of description, members having the same functions as the members described in the foregoing embodiment will be given the same reference signs, and descriptions thereof will not be reiterated.

Second Embodiment

Another embodiment of the present invention will be described below. Note that, for the convenience of description, members having the same functions as the members described in the foregoing embodiment will be given the same reference signs, and descriptions thereof will not be reiterated.

Although FIG. 4 schematically illustrates the relationship between the light-emitting layer including InP based quantum dots and the light absorption layer, the configuration of a specific QLED device will be described in the second embodiment.

Figure 6:
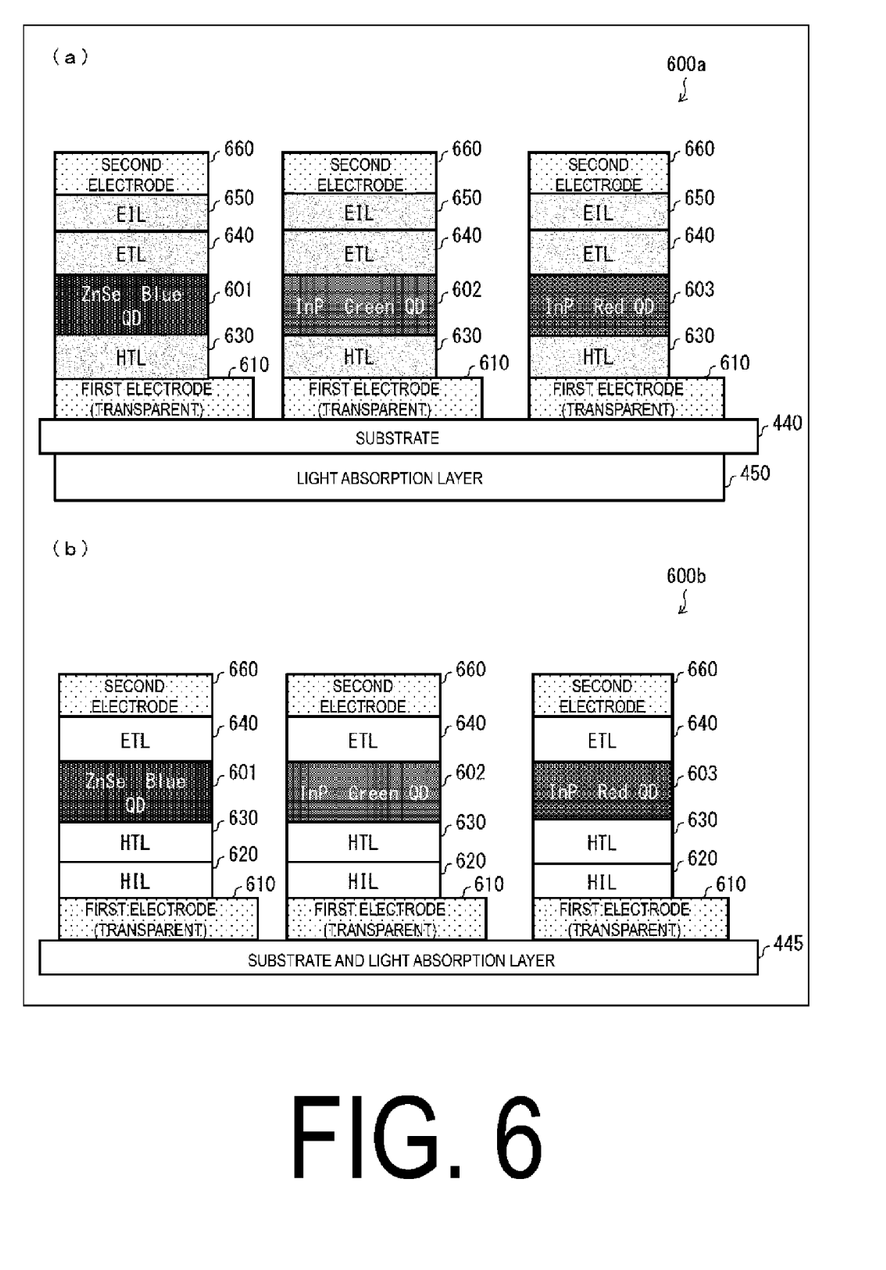
FIG. 6 is a cross-sectional view schematically illustrating QLED devices according to a second embodiment.

FIG. 6 is a cross-sectional view schematically illustrating QLED devices 600a and 600b according to the second embodiment. As in the QLED device 600a illustrated in FIG. 6(a), a substrate 440 is disposed on a light absorption layer 450, first electrodes 610 are deposited on the substrate 440, and hole function layers, light-emitting layers (601, 602, 603), electronic function layers, and second electrodes 660 are deposited thereon in this order. An example in which the hole function layers are composed of hole transport layers (HTL) 630, and the electron function layers are composed of electron transport layers (ETL) 640 and electron injection layers (EIL) 650 deposited thereon is illustrated in FIG. 6(a). In another preferred embodiment, as illustrated in FIG. 6(b), the electron function layers may be composed of electron transport layers (ETL) 640, and the hole function layers may be composed of hole injection layers (HIL) 620 and hole transport layers (HTL) 630 deposited thereon.

In the QLED device 600b illustrated in FIG. 6(b), first electrodes 610 are deposited on a substrate and light absorption layer 445, and hole function layers, light-emitting layers (601, 602, 603), electron function layers, and second electrodes 660 are deposited thereon in this order. An example in which the hole function layers are composed of hole injection layers (HIL) 620 and hole transport layers (HTL) 630 deposited thereon, and the electron function layers are composed of electron transport layers (ETL) 640 is illustrated in FIG. 6(b). In another preferred embodiment, as illustrated in FIG. 6(a), the hole function layers may be composed of hole transport layers (HTL) 630, and the electron function layers may be composed of electron transport layers (ETL) 640 and electron injection layers (EIL) 650 deposited thereon. As illustrated in FIG. 6(b), by using a layer that also serves as a substrate and a light absorption layer, a configuration becomes simpler and the process steps are simplified. Because the distance between the light absorption layer and the light-emitting layer is close, the lateral leakage of light is reduced, and the color field angle dependency is reduced. In FIG. 2(b) with a bottom-emitting type substrate, the substrate and light absorption layer 445 is preferably configured by dispersing light absorbing materials in the resin layer formed from the flattening film 21. Specifically, the resin layer formed from the flattening film 21 is preferably formed from a transparent resin in which silver nanoplates are dispersed. On the other hand, in the case of top-emitting type, the substrate and light absorption layer 445 is preferably configured by dispersing the light absorbing materials in the organic layer formed from the organic buffer film 27 in FIG. 2(a). Specifically, the organic layer formed from the organic buffer film 27 is preferably formed from a transparent organic film.

Here, the first electrodes 610 are preferably transparent electrodes. In particular, in the bottom-emitting type, the first electrodes 610 are preferably transparent electrodes. Specifically, the transparent electrodes are preferably formed from metal oxide films such as IGZO (InGaZnOx: trade name), which is an InGaZnO based oxide semiconductor, ITO, IZO, and the like. The hole injection layers (HIL) 620 are preferably formed from metal oxide films such as IGZO (InGaZnOx: trade name), which is an InGaZnO based oxide semiconductor, ITO, IZO, and the like. In other preferred embodiments, the hole injection layers (HIL) 620 may be composed of organic films such as PEDOT:PSS and the like. The hole transport layers (HTL) 630 are preferably formed from metal oxide films such as NiO, WO3, MoO3, and the like. In other preferred embodiments, the hole transport layers (HTL) 630 may be composed of organic films such as PVK, TFB, and the like.

A blue light-emitting layer 601, a green light-emitting layer 602, and a red light-emitting layer 603 are each deposited on each of the hole transport layers (HTL) 630. The blue light-emitting layer 601 is preferably composed of a ZnSe based material. The green light-emitting layer 602 and the red light-emitting layer 603 are preferably composed of InP based materials. In other embodiments, the blue light-emitting layer 601 is also preferably composed of an InP based material. In a preferred embodiment, the blue light-emitting layer 601 is not limited to ZnSe based materials.

Each of the electron transport layers (ETL) 640 is deposited on each of the light-emitting layers 601, 602, 603. The electron transport layers (ETL) 640 are preferably composed of metal oxide films such as ZnO, ZnMgO, or the like, and oxide nanoparticles can be suitably used. Each of the second electrodes 660 is deposited on each of the electron transport layers (ETL) 640. In a preferred embodiment, the second electrodes 660 are metal electrodes, and Al, Ag, Au, or the like can be used. As described above, the configuration is preferable in which each of the light-emitting layers 601, 602, and 603 is sandwiched between each of the two electrodes 610 and 660. The light absorption layer 450 is provided on a surface of the substrate 440 opposite the surface on which the light-emitting layers 601, 602, and 603 are deposited. It is preferable that the light absorption layer 450 selectively absorbs light at 570 to 610 nm.

In another preferred embodiment with respect to FIG. 6(a), a high efficiency PIN structure (HIL/HTL/each light-emitting layer/ETL/EIL) (not shown) may be used in which the hole injection layers (HIL) 620 are not omitted. In either configuration, the light absorption layer 450 is preferably deposited throughout the substrate. In other embodiments, the light absorption layer 450 is deposited over a portion of the substrate 440 as in FIG. 4(b) so as to function for the output light of the green light-emitting layer 602 and the red light-emitting layer 603. In either configuration, the light absorption layer selectively absorbs light at 570 to 610 nm, thereby reducing the tails of the light emission spectrums of the green color and the red color and achieving a high color reproducibility due to the sharp light emission spectrums.

Third Embodiment

Another embodiment of the disclosure will be described below. Note that, for the convenience of description, members having the same functions as the members described in the foregoing embodiments will be given the same reference signs, and descriptions thereof will not be reiterated.

Figure 7:
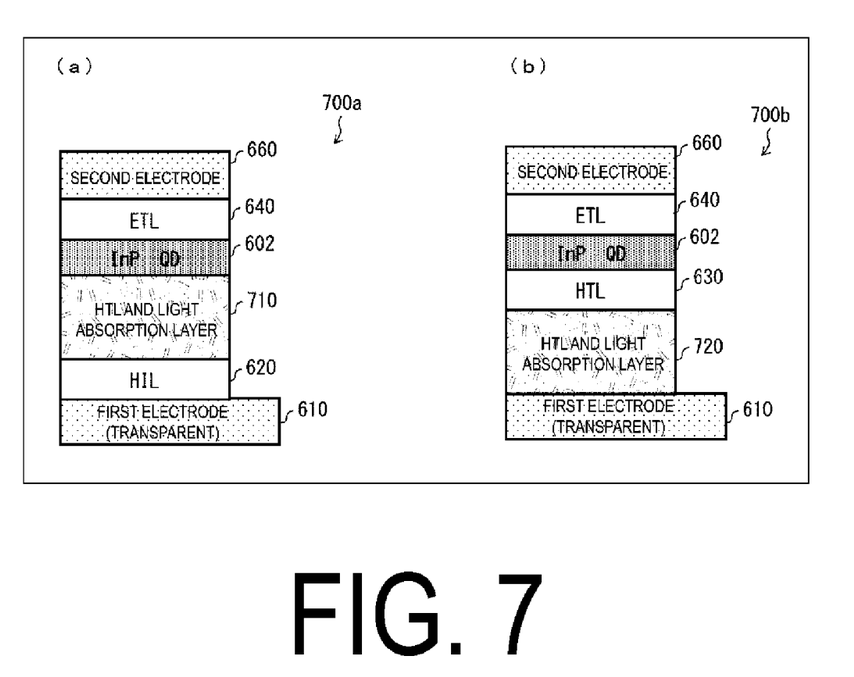
FIG. 7 is a cross-sectional view schematically illustrating a QLED device according to a third embodiment.

FIG. 7 is a cross-sectional view schematically illustrating the QLED devices 700a and 700b according to the third embodiment. In addition to the QLED device 700a illustrated in FIG. 7(a) and the QLED device 700b illustrated in (b), the substrate below the first electrode 610 is omitted. Since the light absorption layer does not contribute to the blue quantum dot light-emitting layer, FIG. 7 illustrates only the green light-emitting layer 602. The red light-emitting layer 603 is also the same as the green light-emitting layer 602, and thus the red light-emitting layer 603 is omitted in FIG. 7.

FIG. 7(a) illustrates that an HTL and light absorption layer 710 is deposited instead of the hole transport layers (HTL) 630 over the hole injection layers (HIL) 620 compared with FIG. 6(b). The hole transport layer (HTL) is configured to also serve as a light absorption layer. The HTL and light absorption layer 710 may be composed of an organic film in which preferably silver nanoplates are dispersed in PVK.

FIG. 7(b) illustrates that an HIL and light absorption layer 720 is deposited instead of the hole injection layers (HIL) 620 over the first electrodes 610 compared with FIG. 6(b). The hole injection layer (HIL) is configured to also serve as a light absorption layer. A hole transport layer (HTL) 630 is deposited on the HIL and light absorption layer 720. The HIL and light absorption layer 720 may be composed of an organic film in which preferably silver nanoplates are dispersed in neutral PEDOT:OSS.

As illustrated in FIG. 7, by using a layer that also serves as a light absorption layer, a configuration becomes simpler and the process steps are simplified. Because the distance between the light absorption layer and the light-emitting layer is close, the lateral leakage of light is reduced, and the color field angle dependency is reduced.

Fourth Embodiment

Another embodiment of the disclosure will be described below. Note that, for the convenience of description, members having the same functions as the members described in the foregoing embodiments will be given the same reference signs, and descriptions thereof will not be reiterated.

Figure 8:
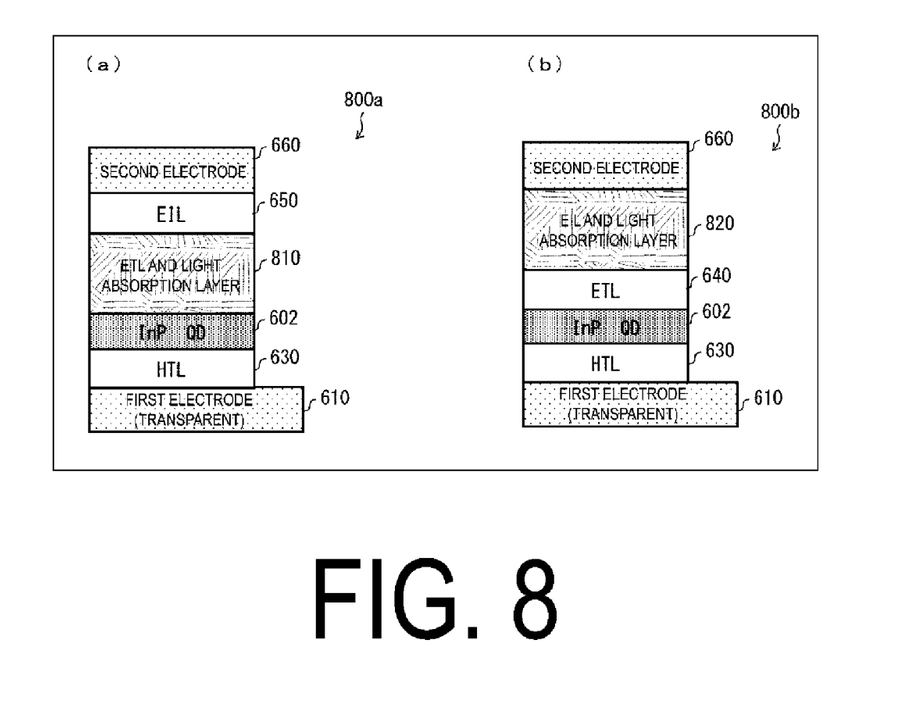
FIG. 8 is a cross-sectional view schematically illustrating a QLED device according to a fourth embodiment.

FIG. 8 is a cross-sectional view schematically illustrating the QLED device 800a and 800b according to the fourth embodiment. In addition to the QLED device 800a illustrated in FIG. 8(a) and the QLED device 800b illustrated in (b), the substrate below the first electrode 610 is omitted. Since the light absorption layer does not contribute to the blue quantum dot light-emitting layer, FIG. 8 illustrates only the green light-emitting layer 602. The red light-emitting layer 603 is also the same as the green light-emitting layer 602, and thus the red light-emitting layer 603 is omitted in FIG. 8.

FIG. 8(a) illustrates that an ETL and light absorption layer 810 is deposited instead of the electron transport layers (ETL) 640 under the electron injection layers (EIL) 650 compared with FIG. 6(a). The electron transport layer (ETL) is configured to also serve as a light absorption layer. The ETL and light absorption layer 810 may be composed of an organic film in which preferably metal nanoplates are dispersed.

FIG. 8(b) illustrates that an EIL and light absorption layer 820 is deposited instead of the electron injection layers (EIL) 650 under the second electrodes 660 compared with FIG. 6(a). The electron injection layer (EIL) is configured to also serve as a light absorption layer. An electron transport layer (ETL) 640 is deposited under the EIL and light absorption layer 820. The EIL and light absorption layer 820 may be composed of an organic film in which preferably metal nanoplates are dispersed.

As illustrated in FIG. 8, by using a layer that also serves as a light absorption layer, a configuration becomes simpler and the process steps are simplified. Because the distance between the light absorption layer and the light-emitting layer is close, the lateral leakage of light is reduced, and the color field angle dependency is reduced.

Fifth Embodiment

Another embodiment of the disclosure will be described below. Note that, for the convenience of description, members having the same functions as the members described in the foregoing embodiments will be given the same reference signs, and descriptions thereof will not be reiterated.

Configuration of Display Device

Figure 9:
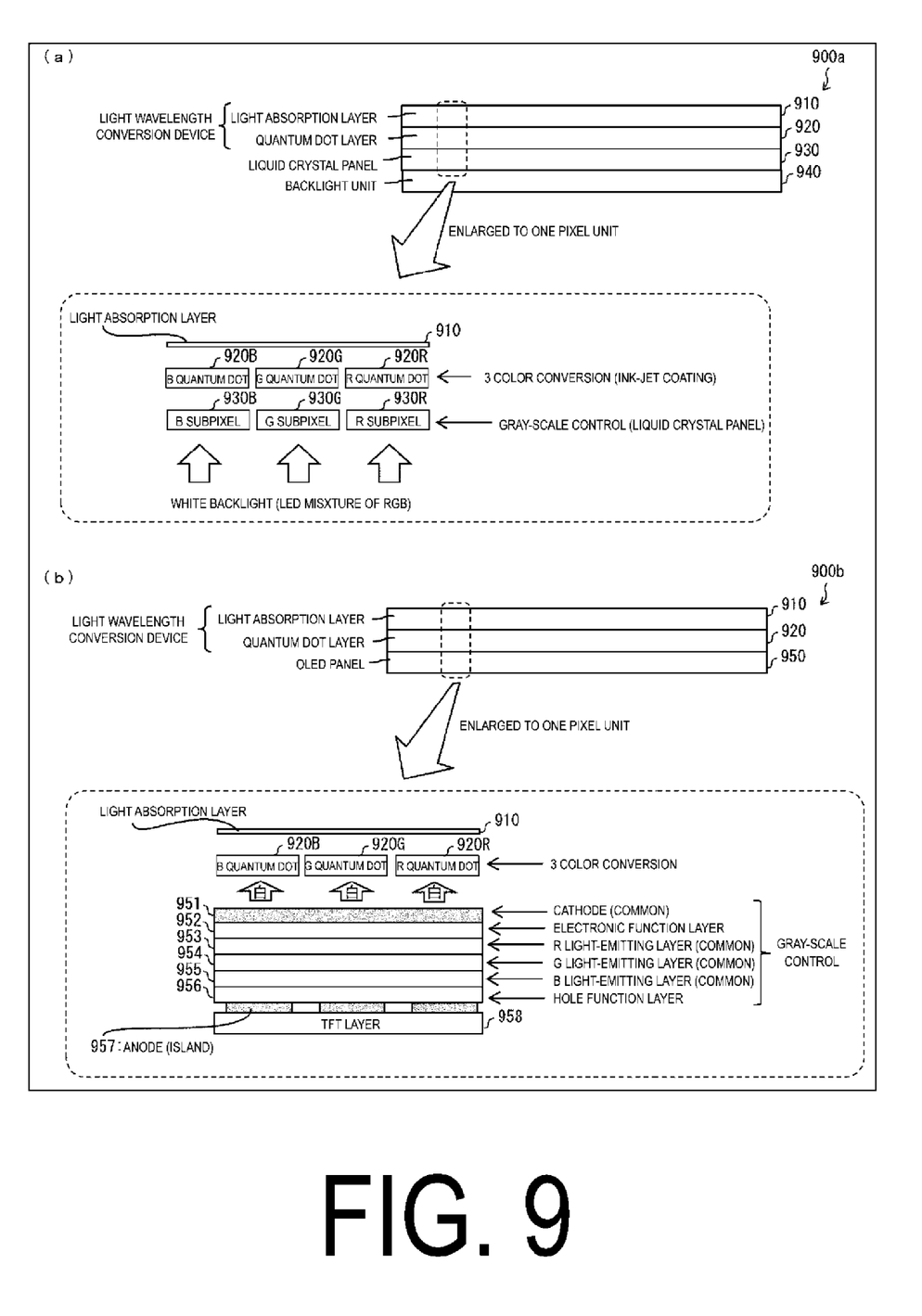
FIG. 9 is a cross-sectional view schematically illustrating a display device according to a fifth embodiment.

FIG. 9 is a cross-sectional view schematically illustrating a display device according to a fifth embodiment. The display device according to the fifth embodiment includes a light wavelength conversion device and a light source. The display device 900a illustrated in FIG. 9(a) uses a liquid crystal unit, and the display device 900b illustrated in FIG. 9(b) uses an OLED panel as the light source of the light wavelength conversion device. In the fifth embodiment, the wavelength conversion device includes a light absorption layer 910 and a quantum dot layer 920. The liquid crystal unit, which is a light source, includes a liquid crystal panel 930 and a backlight unit 940.

Configuration of Liquid Crystal Unit Display Device

An enlarged view of the display device 900a focusing on a pixel unit is illustrated in FIG. 9(a). In a preferred embodiment, a single pixel unit of the liquid crystal panel 930 is composed of a B subpixel 930B, a G subpixel 930G, and an R subpixel 930R. Each of one pixel unit quantum dot layers 920 deposited over each of the subpixels is composed of a B quantum dot 920B (blue), a G quantum dot 920G (green), and an R quantum dot 920R (red). The light absorption layer 910 is deposited on the quantum dot layer 920.

White backlight is emitted from the backlight unit 940. White backlight is preferably white light by an LED mixture of RGB. The white backlight is gray-scale controlled with a liquid crystal panel composed of each subpixel. Light that is gray-scale controlled by each subpixel is incident on the quantum dot layer. The light is wavelength converted to a blue light at the B quantum dot 920B, wavelength converted to a green light at the G quantum dot 920G, and wavelength converted to red light at the R quantum dot 920R. In a preferred embodiment, the G quantum dot 920G (green), and the R quantum dot 920R (red) are composed of InP based materials. On the other hand, the B quantum dot 920B is preferably composed of ZnSe based materials, but are not limited to ZnSe materials. In another preferred embodiment, the B quantum dot 920B can be composed of an InP based material.

Configuration of OLED Display Device

On the other hand, an enlarged view of the display device 900*b* focusing on a pixel unit is illustrated in FIG. 9(*b*). In a preferred embodiment, the OLED panel 950 is gray-scale controlled. In such a configuration, Fine Metal Mask (FMM) deposition is preferably unnecessary. The OLED panel 950 preferably includes island shaped anodes 957 disposed on a TFT layer 958. The island shaped anodes 957 are preferably arranged to correspond to a B quantum dot 920B (blue), a G quantum dot 920G (green), and an R quantum dot 920R (red). A hole function layer 956 is preferably deposited on the island shaped anodes 957, and a blue (B) light-emitting layer 955, a green (G) light-emitting layer 954, and a red (R) light-emitting layer 953 are deposited thereon. An electronic function layer 952 is deposited over the light-emitting layers, and a cathode 951 is deposited thereon. In a preferred embodiment, the hole function layer 956 can be constituted of a hole transport layer (HTL)/a hole injection layer (HIL) alone or a combination thereof, similar to the configuration described in FIG. 6 in the second embodiment. Similarly, the electronic function layer 952 can be constituted of an electron transport layer (ETL)/an electron injection layer (EIL) alone or a combination thereof. White light which is gray-scale controlled by the OLED panel 950 is emitted, and is incident on the quantum dot layer 920 deposited on the OLED panel 950. Similar to the display device 900*a*, each of one pixel unit quantum dot layers 920 is composed of a B quantum dot 920B (blue), a G quantum dot 920G (green), and an R quantum dot 920R (red). The light absorption layer 910 is deposited on the quantum dot layer 920.

The white light emitted from the OLED panel 950 is wavelength converted to a blue light at the B quantum dot 920B, wavelength converted to a green light at the G quantum dot 920G, and wavelength converted to red light at the R quantum dot 920R. In a preferred embodiment, the G quantum dot 920G (green), and the R quantum dot 920R (red) are composed of InP based materials. On the other hand, the B quantum dot 920B is preferably composed of ZnSe based materials, but are not limited to ZnSe materials. In another preferred embodiment, the B quantum dot 920B can be composed of an InP based material.

Configuration of Light Absorption Layer

The light absorption layer 910 may be disposed across the entire quantum dot layer as in FIG. 4(*a*) (corresponding to the light absorption layer 450), or may be disposed in part (only in the regions of the G quantum dot 920G and the R quantum dot 920R) as in FIG. 4(*b*) (corresponding to the light absorption layer 550). The light emission spectrums of the green color and the red color incident on the light absorption layer 910 after light wavelength converted at least in the InP based quantum dot layer have tails. The light emitted from the light absorption layer 910 has reduced tails of the spectrums of the green color and the red color, and thus a higher color reproducibility can be achieved by the sharp light emission spectrums. In any case, because the light absorption layer 910 does not function essentially for the blue light that has been light wavelength converted by the ZnSe based B quantum dot 920B, the light absorption layer 910 can be disposed on a portion of the substrate as illustrated in FIG. 4(*b*).

Supplement

A light-emitting device according to a first aspect of the disclosure includes: an anode electrode (first electrode 610); a cathode electrode (second electrode 660); a plurality of light-emitting layers (green light-emitting layer 420, 602, red light-emitting layer 430, 603) sandwiched between the anode electrode and the cathode electrode; and a light absorption layer (450, 550) disposed between the plurality of light-emitting layers and a light extraction surface, wherein the plurality of light-emitting layers include InP based quantum dots and are configured to emit at least green color of light and red color of light, and the light absorption layer selectively absorbs light at 570 to 610 nm.

According to the configuration described above, a light-emitting device that is Cd free, has high light emission efficiency, and has a wide color reproduction range can be realized.

In the first aspect described above, a light-emitting device according to a second aspect of the disclosure may be configured such that, a peak wavelength in a light emission spectrum of the green color is 520 nm to 550 nm, a peak wavelength in a light emission spectrum of the red color is 620 nm to 650 nm, and each of half widths of the light emission spectrums of the green color and the red color is less than 50 nm.

According to the configuration described above, a light-emitting device that is Cd free, has high light emission efficiency, and has a wide color reproduction range can be realized.

In the first or second aspect described above, a light-emitting device according to a third aspect of the disclosure may be configured such that, a value obtained by dividing a light emission intensity of the green color at a wavelength of a sum of a value of the peak wavelength and a value of the half width of the light emission spectrum of the green color by a peak intensity of the light emission spectrum of the green color is less than 0.02, and a value obtained by dividing a light emission intensity of the red color at a wavelength obtained by subtracting a value of the half width from a value of the peak wavelength of the light emission spectrum of the red color by a peak intensity of the light emission spectrum of the red color is less than 0.08.

According to the configuration described above, a light-emitting device that is Cd free, and has a wide color reproduction range (80% or more in BT.2020 ratio) can be realized.

In the first or second aspect described above, a light-emitting device according to a fourth aspect of the disclosure may be configured such that, wherein a value obtained by dividing a light emission intensity of the light emission spectrum of the green color at a wavelength of 590 nm by a peak intensity of the light emission spectrum of the green color is less than 0.03, and a value obtained by dividing a light emission intensity of the light emission spectrum of the red color at a wavelength of 590 nm by a peak intensity of the light emission spectrum of the red color is less than 0.05.

According to the configuration described above, a light-emitting device having a BT.2020 ratio of 80.0% or more in CIE931 chromaticity diagram can be realized.

In any one of the first to fourth aspects described above, a light-emitting device according to a fifth aspect of the disclosure may be configured such that, the light absorption layer (450, 550) is constituted of materials including a silver nanoplate.

According to the configuration described above, a light-emitting device that is Cd free, has high light emission efficiency, and has a wide color reproduction range can be realized.

In any one of the first to fifth aspects described above, a light-emitting device according to a sixth aspect of the disclosure may further include: a hole transport layer 630 deposited between the anode electrode (first electrode 610) and the plurality of light-emitting layers (green light-emitting layer 420, 602, red light-emitting layer 430, 603), wherein the hole transport layer also serves as the light absorption layer (HTL and light absorption layer 710) due to the hole transport layer including a light absorbing material constituting the light absorption layer.

According to the configuration described above, a light-emitting device with low color field angle dependency can be realized.

In any one of the first to fifth aspects described above, a light-emitting device according to a seventh aspect of the disclosure may further include: a hole injection layer 620 deposited between the anode electrode (first electrode 610) and the plurality of light-emitting layers (green light-emitting layer 420, 602, red light-emitting layer 430, 603), wherein the hole injection layer also serves as the light absorption layer (HIL and light absorption layer 720) due to the hole injection layer including a light absorbing material constituting the light absorption layer.

According to the configuration described above, a light-emitting device with low color field angle dependency can be realized.

A light-emitting device according to an eighth aspect of the disclosure may be a bottom-emitting type light-emitting device provided on a TFT layer provided with a resin layer (flattening film 21) on a top portion, wherein the resin layer (flattening film 21) also serves as the light absorption layer due to the resin layer (flattening film 21) including a light absorbing material constituting the light absorption layer.

According to the configuration described above, a light-emitting device that has a simple creation process, has high light emission efficiency, and has a wide color reproduction range can be realized.

A light-emitting device according to a ninth aspect of the disclosure may be a top-emitting type light-emitting device provided below a sealing layer 6 provided with an organic layer (organic buffer film 27), wherein the organic layer (organic buffer film 27) also serves as the light absorption layer due to the organic layer (organic buffer film 27) including a light absorbing material constituting the light absorption layer.

According to the configuration described above, a light-emitting device that has a simple creation process, has high light emission efficiency, and has a wide color reproduction range can be realized.

A light wavelength conversion device according to a 10th aspect of the disclosure includes: a plurality of wavelength conversion layers (quantum dot layers 920) for wavelength conversion of light having a wavelength of white color; and a light absorption layer 910 disposed between the plurality of wavelength conversion layers (quantum dot layers 920) and a light extraction surface, wherein the plurality of wavelength conversion layers (quantum dot layers 920) include InP based quantum dots, and are configured to wavelength convert light having the wavelength of the white color to at least green color and red color, and the light absorption layer 910 selectively absorbs light at 570 to 610 nm.

According to the configuration described above, a light wavelength conversion device that is Cd free, and has a wide color reproduction range can be realized.

A display device according to a 11th aspect of the disclosure includes: a light wavelength conversion device according to the 10th aspect described above; and a light-emitting apparatus configured to emit light incident on the light wavelength conversion device, wherein the light-emitting apparatus includes a liquid crystal unit (liquid crystal panel 930, backlight unit 940) or an OLED panel 950 for emitting light having a wavelength of white color.

According to the configuration described above, a display device that is Cd free, and has a wide color reproduction range can be realized.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A light-emitting device comprising:
an anode electrode;
a cathode electrode;
a plurality of light-emitting layers sandwiched between the anode electrode and the cathode electrode;
a light absorption layer disposed between the plurality of light-emitting layers and a light extraction surface; and
a substrate provided between the plurality of light-emitting layers and the light absorption layer,
wherein the plurality of light-emitting layers include InP based quantum dots and are configured to emit at least green color of light and red color of light,
the light absorption layer selectively absorbs light at 570 to 610 nm, and
the light absorption layer is provided in a region other than the region upper the region where the substrate deposits a blue light-emitting layer.

2. The light-emitting device according to claim 1, wherein a peak wavelength in a light emission spectrum of the green color is 520 nm to 550 nm,
a peak wavelength in a light emission spectrum of the red color is 620 nm to 650 nm, and
each of half widths of the light emission spectrums of the green color and the red color is less than 50 nm.

3. The light-emitting device according to claim 1, wherein a value obtained by dividing a light emission intensity of the green color at a wavelength of a sum of a value of a peak wavelength and a value of a half width of a light emission spectrum of the green color by a peak intensity of the light emission spectrum of the green color is less than 0.02, and
a value obtained by dividing a light emission intensity of the red color at a wavelength obtained by subtracting a value of a half width from a value of a peak wavelength of a light emission spectrum of the red color by a peak intensity of the light emission spectrum of the red color is less than 0.08.

4. The light-emitting device according to claim 1, wherein a value obtained by dividing a light emission intensity of a light emission spectrum of the green color at a wavelength of 590 nm by a peak intensity of the light emission spectrum of the green color is less than 0.03, and a value obtained by dividing a light emission intensity of a light emission spectrum of the red color at a wavelength of 590 nm by a peak intensity of the light emission spectrum of the red color is less than 0.05.

5. The light-emitting device according to claim 1, wherein the light absorption layer comprises materials including a metal nanoplate.

6. The light-emitting device according to claim 1, further comprising:
a hole transport layer deposited between the anode electrode and the plurality of light-emitting layers,
wherein the hole transport layer also serves as the light absorption layer due to the hole transport layer including a light absorbing material included in the light absorption layer.

7. The light-emitting device according to claim 1, further comprising:
a hole injection layer deposited between the anode electrode and the plurality of light-emitting layers,
wherein the hole injection layer also serves as the light absorption layer due to the hole injection layer including a light absorbing material included in the light absorption layer.

8. The light-emitting device according to claim 1, wherein the light-emitting device is a bottom-emitting type light-emitting device provided on a TFT layer provided with a resin layer on a top portion of the TFT layer, and
the resin layer also serves as the light absorption layer due to the resin layer including a light absorbing material included in the light absorption layer.

9. The light-emitting device according to claim 1, wherein the light-emitting device is a top-emitting type light-emitting device provided below a sealing layer provided with an organic layer, and
the organic layer also serves as the light absorption layer due to the organic layer including a light absorbing material included in the light absorption layer.

10. A light wavelength conversion device comprising:
a plurality of wavelength conversion layers for wavelength conversion of light having a wavelength of white color; and
a light absorption layer disposed between the plurality of wavelength conversion layers and a light extraction surface,
wherein the plurality of wavelength conversion layers include InP based quantum dots, and are configured to wavelength convert light having the wavelength of the white color to at least green color and red color,
the light absorption layer selectively absorbs light at 570 to 610 nm, and
the light absorption layer is provided only for outputting light of the green color and the red color.

11. A display device comprising:
the light wavelength conversion device according to claim 10; and
a light-emitting apparatus configured to emit light incident on the light wavelength conversion device,
wherein the light-emitting apparatus includes a liquid crystal unit or an OLED panel for emitting light having a wavelength of white color.

12. The light wavelength conversion device according to claim 10, further comprising:
a substrate provided between the plurality of wavelength conversion layers and the light absorption layer.

\* \* \* \* \*